(12) United States Patent
Natarajan et al.

(10) Patent No.: US 11,145,389 B2
(45) Date of Patent: Oct. 12, 2021

(54) DETECTION AND ERROR-HANDLING OF HIGH ERROR RATE BLOCKS DURING COPYBACK

(71) Applicant: Intel Corporation, Santa Clara, CA (US)

(72) Inventors: Shankar Natarajan, Folsom, CA (US);
Sriram Natarajan, Folsom, CA (US);
Arun S. Athreya, Folsom, CA (US);
Venkata S. Surampudi, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 26 days.

(21) Appl. No.: 16/702,290

(22) Filed: Dec. 3, 2019

(65) Prior Publication Data

US 2020/0105363 A1  Apr. 2, 2020

(51) Int. Cl.
*G11C 29/00* (2006.01)
*G11C 29/38* (2006.01)
*G11C 16/04* (2006.01)

(52) U.S. Cl.
CPC ........... *G11C 29/883* (2013.01); *G11C 29/38* (2013.01); *G11C 16/0483* (2013.01)

(58) Field of Classification Search
CPC ... G11C 29/883; G11C 29/38; G11C 16/0483; G11C 16/349; G11C 2029/0409; G11C 29/4401

See application file for complete search history.

(56) References Cited

U.S. PATENT DOCUMENTS

| | | | | |
|---|---|---|---|---|
| 2010/0287443 | A1* | 11/2010 | Rohleder | G06F 11/1645 |
| | | | | 714/758 |
| 2012/0030542 | A1* | 2/2012 | Borchers | G06F 12/0246 |
| | | | | 714/764 |
| 2016/0019111 | A1* | 1/2016 | Kochar | G06F 11/0751 |
| | | | | 714/6.12 |
| 2018/0061494 | A1* | 3/2018 | Hwang | G11C 16/105 |
| 2018/0246794 | A1* | 8/2018 | Baty | G06F 11/3037 |
| 2019/0332509 | A1* | 10/2019 | Norrie | G06F 11/302 |
| 2020/0089581 | A1* | 3/2020 | Lee | G11C 16/30 |

OTHER PUBLICATIONS

Micron, "TN-29-41: Using COPYBACK Operations in NAND Flash Devices", Micron Technology, Inc. Pdf: 09005aef83580b4c/ source: 09005aef83580c04, tn2941_idm_copyback.fm, Rev. A, Oct. 2008.

* cited by examiner

*Primary Examiner* — Thien Nguyen
(74) *Attorney, Agent, or Firm* — Green, Howard & Mughal LLP.

(57) ABSTRACT

An embodiment of an electronic apparatus may include one or more substrates, and logic coupled to the one or more substrates, the logic to control a persistent storage media including a first media to store one or more source blocks of data and a second media to store one or more destination blocks of data, determine if an error rate associated with a read of a particular destination block of the one or more destination blocks exceeds a threshold error rate, identify a particular source block of the one or more source blocks which corresponds to erroneous data in the particular destination block, determine which of the particular source block and the particular destination block is a failed block, and retire the failed block. Other embodiments are disclosed and claimed.

20 Claims, 10 Drawing Sheets

DETECTION AND ERROR-HANDLING OF HIGH ERROR RATE BLOCKS DURING COPYBACK

BACKGROUND

Copyback, sometimes also referred to as internal data move (IDM), refers to a NAND flash memory or solid state drive (SSD) operation where data is read from one location in memory and written to another location. The data generally does not move through the host. A copyback operation may be useful for a variety of memory management techniques including, for example, garbage collection, wear levelling, and error correction. An internal copyback operation may lead to errors because NAND chips do not include internal error detection and correction.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
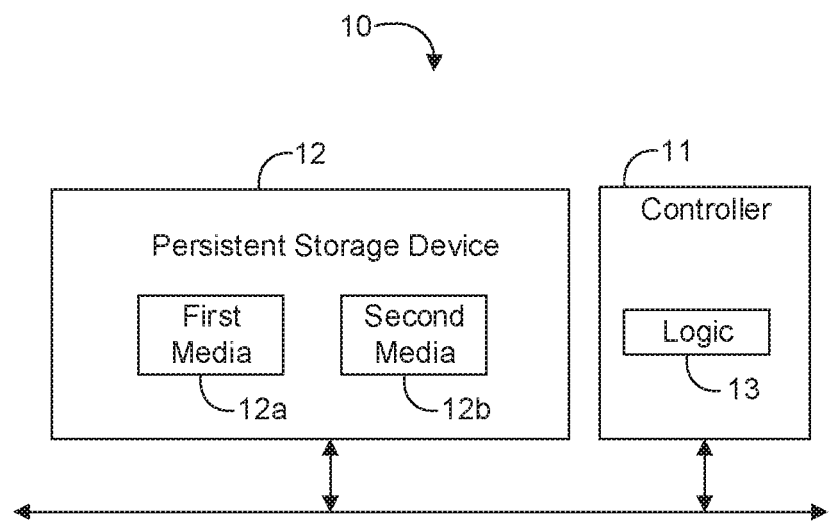
FIG. 1 is a block diagram of an example of an electronic storage system according to an embodiment.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

While the following description sets forth various implementations that may be manifested in architectures such as system-on-a-chip (SoC) architectures for example, implementation of the techniques and/or arrangements described herein are not restricted to particular architectures and/or computing systems and may be implemented by any architecture and/or computing system for similar purposes. For instance, various architectures employing, for example, multiple integrated circuit (IC) chips and/or packages, and/or various computing devices and/or consumer electronic (CE) devices such as set top boxes, smartphones, etc., may implement the techniques and/or arrangements described herein. Further, while the following description may set forth numerous specific details such as logic implementations, types and interrelationships of system components, logic partitioning/integration choices, etc., claimed subject matter may be practiced without such specific details. In other instances, some material such as, for example, control structures and full software instruction sequences, may not be shown in detail in order not to obscure the material disclosed herein.

The material disclosed herein may be implemented in hardware, firmware, software, or any combination thereof. The material disclosed herein may also be implemented as instructions stored on a machine-readable medium, which may be read and executed by one or more processors. A machine-readable medium may include any medium and/or mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others.

References in the specification to "one implementation", "an implementation", "an example implementation", etc., indicate that the implementation described may include a particular feature, structure, or characteristic, but every embodiment may not necessarily include the particular feature, structure, or characteristic. Moreover, such phrases are not necessarily referring to the same implementation. Further, when a particular feature, structure, or characteristic is described in connection with an embodiment, it is submitted that it is within the knowledge of one skilled in the art to effect such feature, structure, or characteristic in connection with other implementations whether or not explicitly described herein.

Methods, devices, systems, and articles are described herein related to storage systems. More particularly, some embodiments relate to an improved dynamic single level cell memory controller.

Various embodiments described herein may include a memory component and/or an interface to a memory component. Such memory components may include volatile and/or nonvolatile (NV) memory. Volatile memory may be a storage medium that requires power to maintain the state of data stored by the medium. Non-limiting examples of volatile memory may include various types of random access memory (RAM), such as dynamic RAM (DRAM) or static RAM (SRAM). One particular type of DRAM that may be used in a memory module is synchronous dynamic RAM (SDRAM). In particular embodiments, DRAM of a memory component may comply with a standard promulgated by Joint Electron Device Engineering Council (JEDEC), such as JESD79F for double data rate (DDR) SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4 (these standards are available at jedec.org). Such standards (and similar standards) may be referred to as DDR-based standards and communication interfaces of the storage devices that implement such standards may be referred to as DDR-based interfaces.

NV memory (NVM) may be a storage medium that does not require power to maintain the state of data stored by the medium. In one embodiment, the memory device may include a block addressable memory device, such as those based on NAND or NOR technologies. A memory device may also include future generation nonvolatile devices, such as a three dimensional (3D) crosspoint memory device, or other byte addressable write-in-place nonvolatile memory devices. In one embodiment, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor RAM (FeTRAM), anti-ferroelectric memory, magnetoresistive RAM (MRAM) memory that incorporates memristor technology, resistive memory including the metal oxide base, the oxygen vacancy base and the conductive bridge RAM (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory. The memory device may refer to the die itself and/or to a packaged memory product. In particular embodiments, a memory component with nonvolatile memory may comply with one or more standards promulgated by the JEDEC, such as JESD218, JESD219, JESD220-1, JESD223B, JESD223-1, or other suitable standard (the JEDEC standards cited herein are available at jedec.org).

With reference to FIG. 1, an embodiment of an electronic storage system 10 may include persistent storage media 12 including a first media 12a to store one or more source blocks of data and a second media 12b to store one or more destination blocks of data, and a controller 11 coupled to the persistent storage media 12. The controller 11 may include logic 13 to determine if an error rate associated with a read of a particular destination block of the one or more destination blocks exceeds a threshold error rate, identify a particular source block of the one or more source blocks which corresponds to erroneous data in the particular destination block, determine which of the particular source block and the particular destination block is a failed block, and retire the failed block. For example, the logic 13 may be configured to determine if a read of the particular source block fails or passes, retire the particular source block if the read is determined to fail, and retire the particular destination block if the read is determined to pass. In some embodiments, the logic 13 may also be configured to determine if the particular source block has valid data prior to the read of the particular source block, and program dummy data to the particular source block if the particular source block is determined to not have valid data.

In some embodiments, the logic 13 may be further configured to store data from the particular source block to the particular destination block, store metadata associated with the particular destination block which identifies the particular source block as a source of the data stored to the particular destination block, receive a read request for the particular destination block, read the data requested from the particular destination block, determine if the error rate associated with the read of the data exceeds the threshold error rate, move the data from the particular destination block to a second destination block if the error rate is determined to exceed the threshold error rate, and identify the particular source block based on the stored metadata associated with the particular destination block. For example, the logic 13 may also be configured to maintain a data structure which includes metadata to identify original source blocks for data stored in the one or more destination blocks. In any of the embodiments herein, the persistent storage media 12 may comprise a SSD, and/or one or more of a block size characteristic and a performance characteristic may be different with respect to the first media 12a and the second media 12b. For example, the first media 12a may comprise faster media as compared to the second media 12b.

Embodiments of each of the above controller 11, persistent storage media 12, first media 12a, second media 12b, logic 13, and other system components may be implemented in hardware, software, or any suitable combination thereof. For example, hardware implementations may include configurable logic such as, for example, programmable logic arrays (PLAs), field programmable gate arrays (FPGAs), complex programmable logic devices (CPLDs), or fixed-functionality logic hardware using circuit technology such as, for example, application specific integrated circuit (ASIC), complementary metal oxide semiconductor (CMOS) or transistor-transistor logic (TTL) technology, or any combination thereof. Embodiments of the controller 11 may include a general purpose controller, a special purpose controller, a memory controller, a storage controller, a micro-controller, a general purpose processor, a special purpose processor, a central processor unit (CPU), an execution unit, etc. In some embodiments, the persistent storage media 12, and/or the logic 13 may be located in, or co-located with, various components, including the controller 11 (e.g., on a same die).

Alternatively, or additionally, all or portions of these components may be implemented in one or more modules as a set of logic instructions stored in a machine- or computer-readable storage medium such as random access memory (RAM), read only memory (ROM), programmable ROM (PROM), firmware, flash memory, etc., to be executed by a processor or computing device. For example, computer program code to carry out the operations of the components may be written in any combination of one or more operating system (OS) applicable/appropriate programming languages, including an object-oriented programming language such as PYTHON, PERL, JAVA, SMALLTALK, C++, C # or the like and conventional procedural programming languages, such as the "C" programming language or similar programming languages. For example, the persistent storage media 12, other persistent storage media, or other system memory may store a set of instructions which when executed by the controller 11 cause the system 10 to implement one or more components, features, or aspects of the system 10 (e.g., the logic 13, determining if the error rate associated with the read of the particular destination block exceeds the threshold error rate, identifying the particular source block which corresponds to erroneous data in the particular destination block, determining which block is the failed block, retiring the failed block, etc.).

Figure 2:
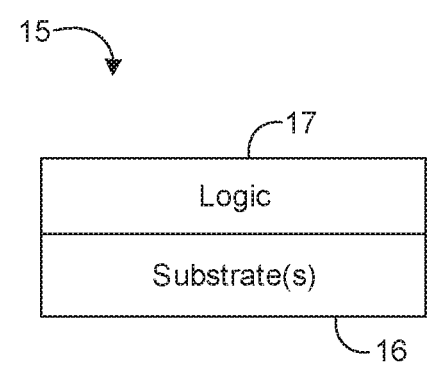
FIG. 2 is a block diagram of an example of an electronic apparatus according to an embodiment.
Figure 3A:
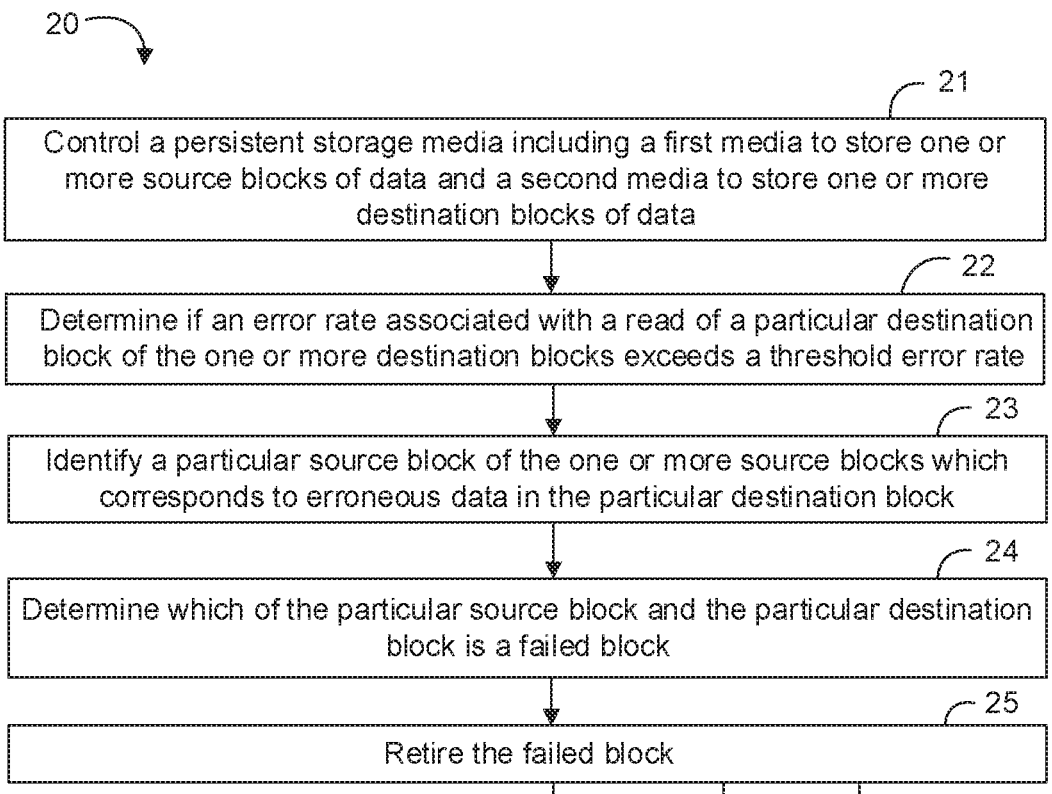
FIGS. 3A to 3E are flowcharts of an example of a method of controlling storage according to an embodiment.
Figure 3B:
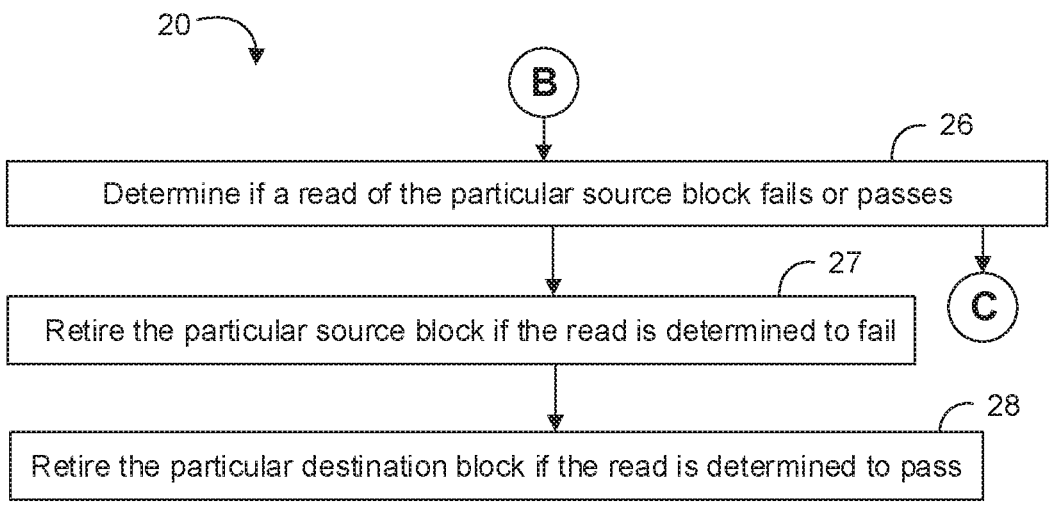
Figure 3C:
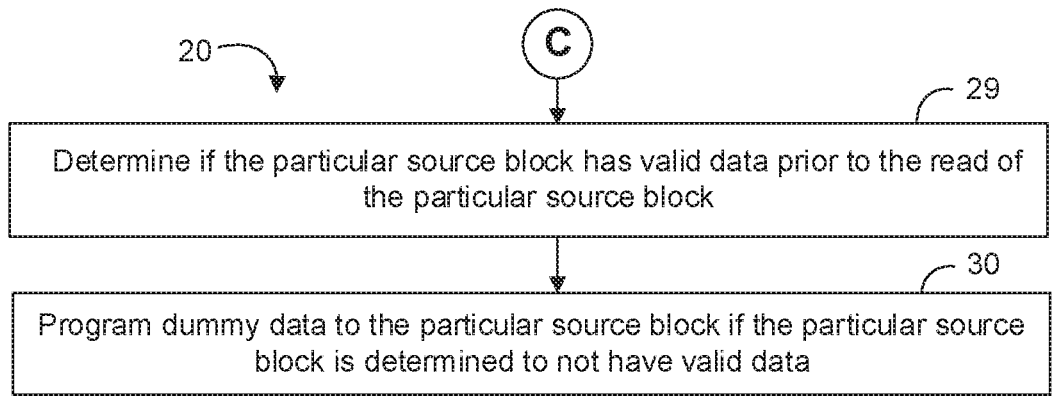
Figure 3D:
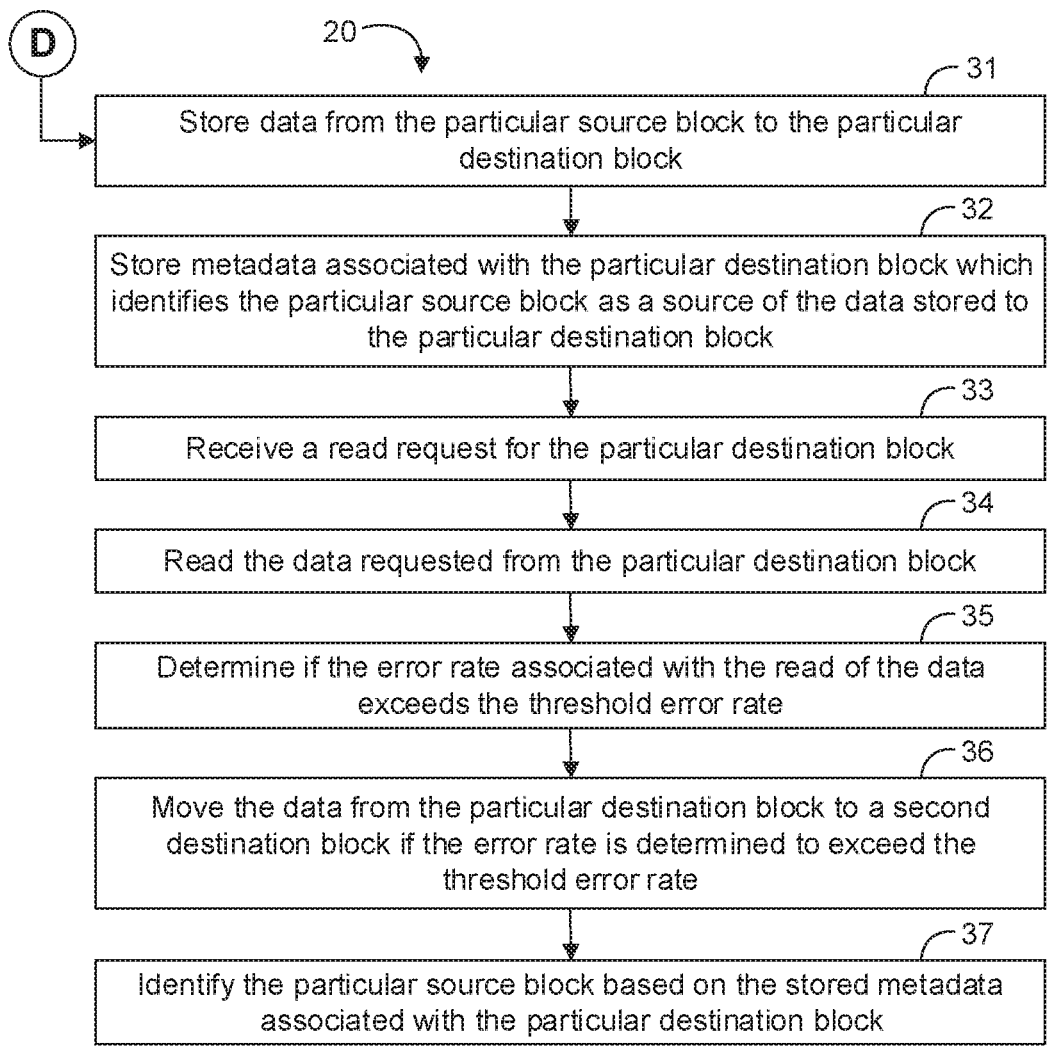
Figure 3E:
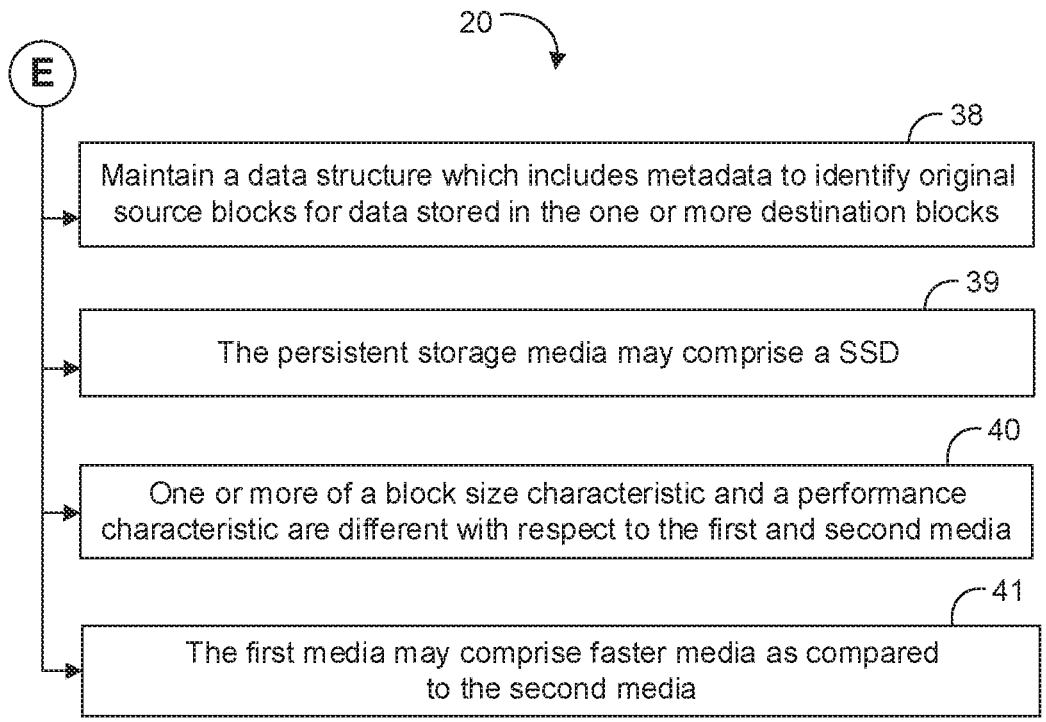

Turning now to FIG. 2, an embodiment of an electronic apparatus 15 may include one or more substrates 16, and logic 17 coupled to the one or more substrates 16. The logic 17 may be configured to control a persistent storage media including a first media to store one or more source blocks of data and a second media to store one or more destination blocks of data, determine if an error rate associated with a read of a particular destination block of the one or more destination blocks exceeds a threshold error rate, identify a particular source block of the one or more source blocks which corresponds to erroneous data in the particular destination block, determine which of the particular source block and the particular destination block is a failed block, and retire the failed block. For example, the logic 17 may be configured to determine if a read of the particular source block fails or passes, retire the particular source block if the read is determined to fail, and retire the particular destination block if the read is determined to pass. In some embodiments, the logic 17 may also be configured to determine if the particular source block has valid data prior to the read of the particular source block, and program dummy data to the particular source block if the particular source block is determined to not have valid data.

In some embodiments, the logic 17 may be further configured to store data from the particular source block to the particular destination block, store metadata associated with the particular destination block which identifies the particular source block as a source of the data stored to the particular destination block, receive a read request for the particular destination block, read the data requested from the particular destination block, determine if the error rate associated with the read of the data exceeds the threshold error rate, move the data from the particular destination block to a second destination block if the error rate is determined to exceed the threshold error rate, and identify the particular source block based on the stored metadata associated with the particular destination block. For example, the logic 17 may also be configured to maintain a data structure which includes metadata to identify original source blocks for data stored in the one or more destination blocks. In any of the embodiments herein, the persistent storage media may comprise a SSD, and one or more of a block size characteristic and a performance characteristic may be different with respect to the first and second media. For example, the first media may comprise faster media as compared to the second media.

Embodiments of the logic 17 may be implemented in a system, apparatus, computer, device, etc., for example, such as those described herein. More particularly, hardware implementations of the logic 17 may include configurable logic such as, for example, PLAs, FPGAs, CPLDs, or in fixed-functionality logic hardware using circuit technology such as, for example, ASIC, CMOS, or TTL technology, or any combination thereof. Alternatively, or additionally, the logic 17 may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C # or the like and conventional procedural programming languages, such as the "C" programming language or similar programming languages.

For example, the logic 17 may be implemented on a semiconductor apparatus which may include the one or more substrates 16, with the logic 17 coupled to the one or more substrates 16. In some embodiments, the logic 17 may be at least partly implemented in one or more of configurable logic and fixed-functionality hardware logic on semiconductor substrate(s) (e.g., silicon, sapphire, gallium-arsenide, etc.). For example, the logic 17 may include a transistor array and/or other integrated circuit components coupled to the substrate(s) 16 with transistor channel regions that are positioned within the substrate(s) 16. The interface between the logic 17 and the substrate(s) 16 may not be an abrupt junction. The logic 17 may also be considered to include an epitaxial layer that is grown on an initial wafer of the substrate(s) 16.

Turning now to FIGS. 3A to 3E, an embodiment of a method 20 of controlling storage may include controlling a persistent storage media including a first media to store one or more source blocks of data and a second media to store one or more destination blocks of data at box 21, determining if an error rate associated with a read of a particular destination block of the one or more destination blocks exceeds a threshold error rate at box 22, identifying a particular source block of the one or more source blocks which corresponds to erroneous data in the particular destination block at box 23, determining which of the particular source block and the particular destination block is a failed block at box 24, and retiring the failed block at box 25. For example, the method 20 may include determining if a read of the particular source block fails or passes at box 26, retiring the particular source block if the read is determined to fail at box 27, and retiring the particular destination block if the read is determined to pass at box 28. Some embodiments of the method 20 may also include determining if the particular source block has valid data prior to the read of the particular source block at box 29, and programming dummy data to the particular source block if the particular source block is determined to not have valid data at box 30.

Some embodiments of the method 20 may further include storing data from the particular source block to the particular destination block at box 31, storing metadata associated with the particular destination block which identifies the particular source block as a source of the data stored to the particular destination block at box 32, receiving a read request for the particular destination block at box 33, reading the data requested from the particular destination block at box 34, determining if the error rate associated with the read of the data exceeds the threshold error rate at box 35, moving the data from the particular destination block to a second destination block if the error rate is determined to exceed the threshold error rate at box 36, and identifying the particular source block based on the stored metadata associated with the particular destination block at box 37. For example, the method 20 may also include maintaining a data structure which includes metadata to identify original source blocks for data stored in the one or more destination blocks at box 38. In any of the embodiments herein, the persistent storage media may comprise a SSD at box 39, and/or one or more of a block size characteristic and a performance characteristic are different with respect to the first and second media at box 40. For example, the first media may comprise faster media as compared to the second media at box 41.

Embodiments of the method 20 may be implemented in a system, apparatus, computer, device, etc., for example, such as those described herein. More particularly, hardware implementations of the method 20 may include configurable logic such as, for example, PLAs, FPGAs, CPLDs, or in fixed-functionality logic hardware using circuit technology such as, for example, ASIC, CMOS, or TTL technology, or any combination thereof. Alternatively, or additionally, the method 20 may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C # or the like and conventional procedural programming languages, such as the "C" programming language or similar programming languages.

For example, the method 20 may be implemented on a computer readable medium as described in connection with Examples 22 to 28 below. Embodiments or portions of the method 20 may be implemented in firmware, applications (e.g., through an application programming interface (API)), or driver software running on an operating system (OS). Additionally, logic instructions might include assembler instructions, instruction set architecture (ISA) instructions, machine instructions, machine dependent instructions, microcode, state-setting data, configuration data for integrated circuitry, state information that personalizes electronic circuitry and/or other structural components that are native to hardware (e.g., host processor, central processing unit/CPU, microcontroller, etc.).

Figure 4:
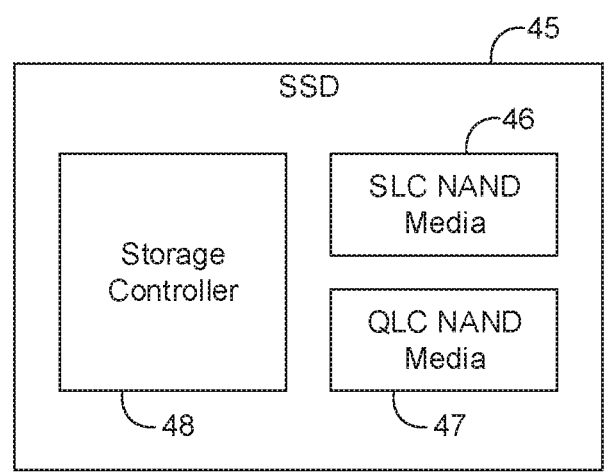
FIG. 4 is a block diagram of an example of another electronic storage system according to an embodiment.

Turning now to FIG. 4, an embodiment of a SSD 45 may include single level cell (SLC) NAND media 46, quad level cell (QLC) NAND media 47, and a storage controller 48. For example, the SLC NAND media 46 may have a smaller block size and provide faster performance as compared to the QLC NAND media 47. To improve the performance for the slower media (e.g., such as the QLC NAND media 47), the SSD 45 may support a copyback operation. For example, the copyback operation may be utilized to improve sequential write performance As part of the copyback operation, data is copied from the faster media (e.g., the SLC NAND media 46) to the slower media (e.g., the QLC NAND media 47) without any checks performed for bit errors. Some embodiments advantageously provide technology to prevent unnecessary retirement of blocks in the QLC NAND media 47 caused by corrupt data in the SLC NAND media 46. For example, such an issue may be observed when a source block in the faster SLC NAND media 46 has corrupted data that is copied to a destination block in the slower QLC NAND media 47 and goes unnoticed (e.g., as may occur during a copyback operation). This issue may trigger multiple retired destination blocks from the QLC NAND media 47 (e.g., if a same corrupted source block is used for multiple copyback operations to different destination blocks) and lead to the SSD 45 running out of spares.

In some embodiments, the SLC NAND media 46 is utilized to store one or more source blocks of data and the QLC NAND media 47 is utilized to store one or more destination blocks of data. The storage controller 48 is configured to determine if an error rate associated with a read of a particular destination block of the one or more destination blocks exceeds a threshold error rate, to identify a particular source block of the one or more source blocks which corresponds to erroneous data in the particular destination block, to determine which of the particular source block and the particular destination block is a failed block, and to retire the failed block. For example, the storage controller 48 may be configured to determine if a read of the particular source block fails or passes, retire the particular source block if the read is determined to fail, and retire the particular destination block if the read is determined to pass. In some embodiments, the storage controller 48 may also be configured to determine if the particular source block has valid data prior to the read of the particular source block, and program dummy data to the particular source block if the particular source block is determined to not have valid data.

In some embodiments, the storage controller 48 may be further configured to store data from the particular source block to the particular destination block, store metadata associated with the particular destination block which identifies the particular source block as a source of the data stored to the particular destination block, receive a read request for the particular destination block, read the data requested from the particular destination block, determine if the error rate associated with the read of the data exceeds the threshold error rate, move the data from the particular destination block to a second destination block if the error rate is determined to exceed the threshold error rate, and identify the particular source block based on the stored metadata associated with the particular destination block. For example, the storage controller 48 may also be configured to maintain a data structure which includes metadata to identify original source blocks for data stored in the one or more destination blocks.

Embodiments of the SSD 45, the SLC NAND media 46, the QLC NAND media 47, and/or the storage controller 48 may be implemented in a system, apparatus, computer, device, etc., for example, such as those described herein. More particularly, hardware implementations of the SSD 45 may include configurable logic such as, for example, PLAs, FPGAs, CPLDs, or in fixed-functionality logic hardware using circuit technology such as, for example, ASIC, CMOS, or TTL technology, or any combination thereof. Alternatively, or additionally, aspects of the storage controller 48 may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more machine languages or OS applicable/appropriate programming languages, including an object-oriented programming language such as PYTHON, PERL, JAVA, SMALLTALK, C++, C # or the like and conventional procedural programming languages, such as the "C" programming language or similar programming languages.

Some embodiments may advantageously provide technology for detection and error-handling of high uncorrectable bit error rate (UBER) blocks during copyback. Some embodiments may utilize firmware employed mitigation technology that monitors the original failing block and helps ensure that firmware marks and tracks the potential defective source block in fast media when a potential bad destination block in QLC is to be moved. Advantageously, some embodiments may be readily implemented in a storage controller without much firmware overhead and no significant performance impact. Some embodiments may also advantageously reduces dependency on using additional validation features such as a full verify of all source blocks or a full verify of a destination block, both of which require significant validation time.

Figure 5:
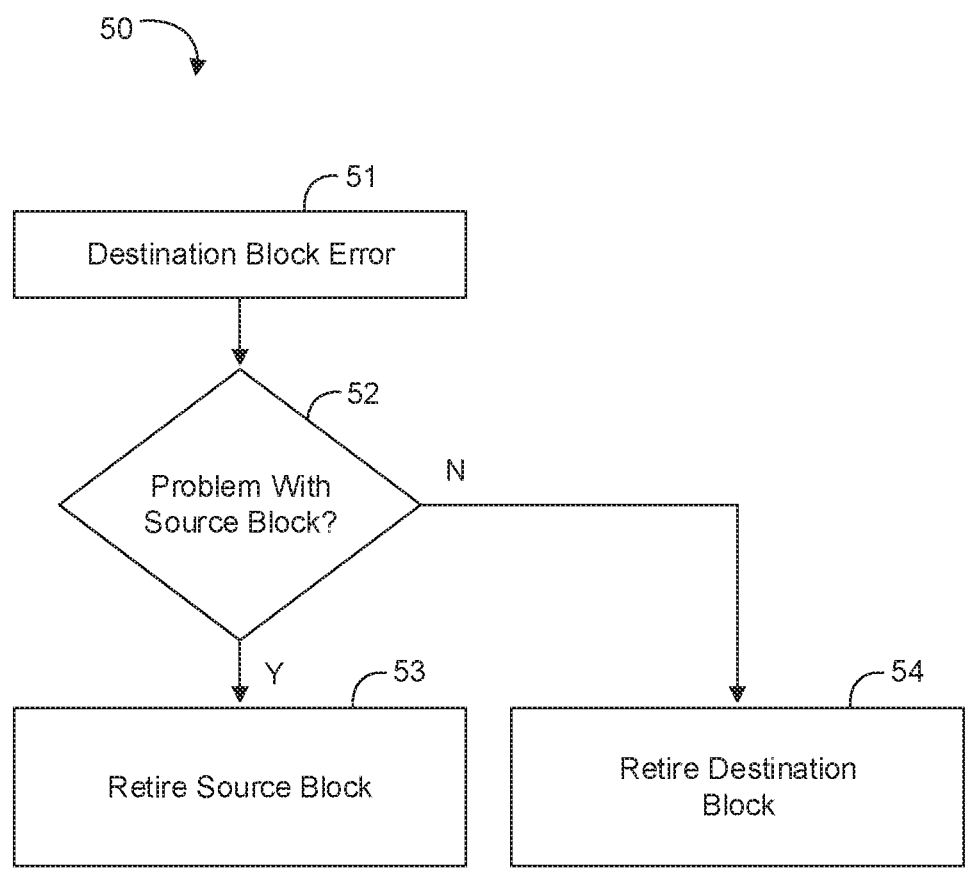
FIG. 5 is a flowchart of an example of another method of controlling storage according to an embodiment.

With reference to FIG. 5, an embodiment of a method 50 of controlling storage may include identifying a destination block error at box 51. For example, the destination block error may be identified when the destination block is read. If a read of the destination block results in a high UBER (e.g., in excess of a threshold error rate), the data may be moved to a new destination block location. In conventional NAND controllers, the destination block with the high UBER may then be retired. Advantageously, some embodiments of the method 50 may instead include determining if there is a problem with a source block at box 52. If the problem is with the source block, the method may include retiring the source block at box 53. Otherwise, the method 50 may proceed to retiring the destination block at box 54. Advantageously, some embodiments may avoid unnecessarily retiring the destination block, avoid unnecessarily reducing the amount of spares for an SSD, and avoid having a corrupt source block continue to send bad data to the destination blocks.

Figure 6:
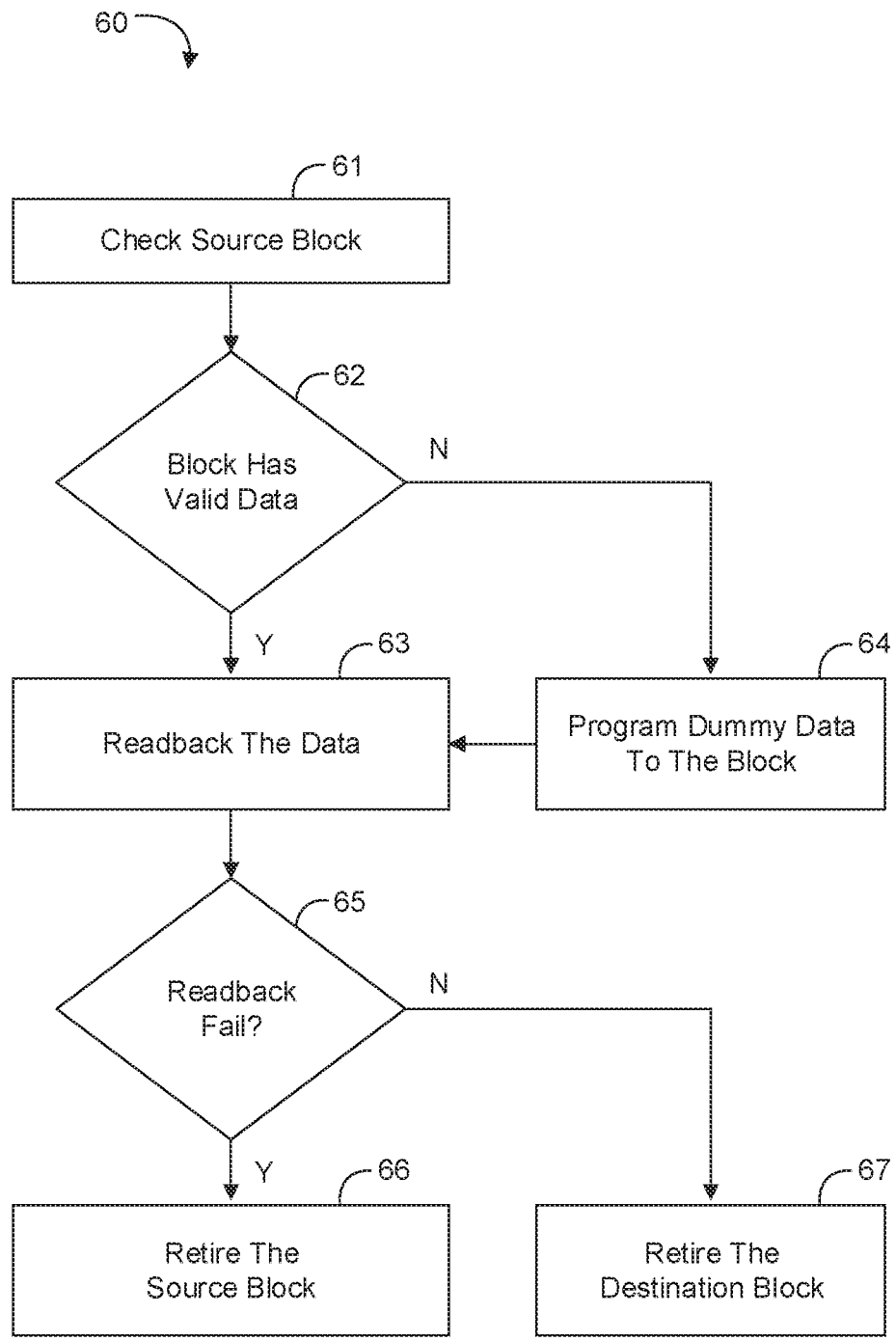
FIG. 6 is a flowchart of an example of another method of controlling storage according to an embodiment.

With reference to FIG. 6, an embodiment of a method 60 of controlling storage may start with checking a source block at block 61 (e.g., in response to detecting an error in a destination block). The method 60 may include determining if the source block has valid data at block 62. If so, the method 60 may include reading back the data from the source block at box 63.

Otherwise, the method 60 may include programming dummy data to the source block at box 64 and then reading back the data from the source block at box 63. The method 60 may then proceed to determining if the readback failed at box 65. If so, the method 60 may include retiring the source block at box 66. Otherwise, the method 60 may include retiring the destination block at box 67. Advantageously, some embodiments may avoid unnecessarily retiring the destination block, avoid unnecessarily reducing the amount of spares for an SSD, and avoid having a corrupt source block continue to send bad data to the destination blocks.

Figure 7A:
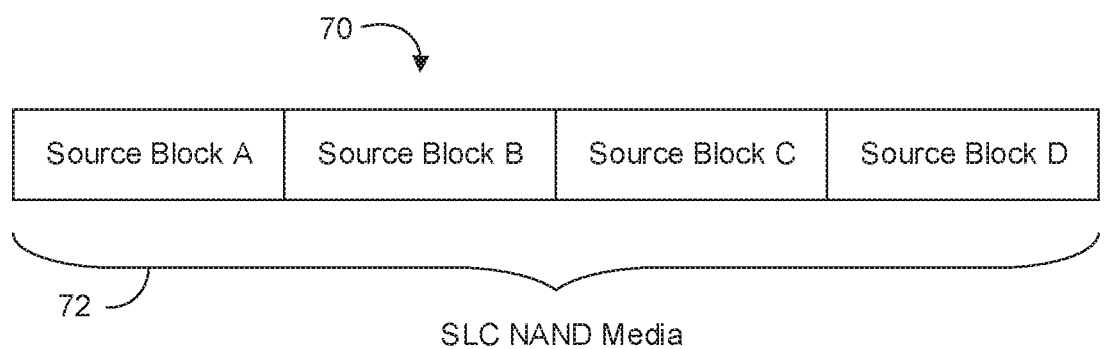
FIGS. 7A to 7B are illustrative diagrams of an example of a NAND media organization according to an embodiment.
Figure 7B:
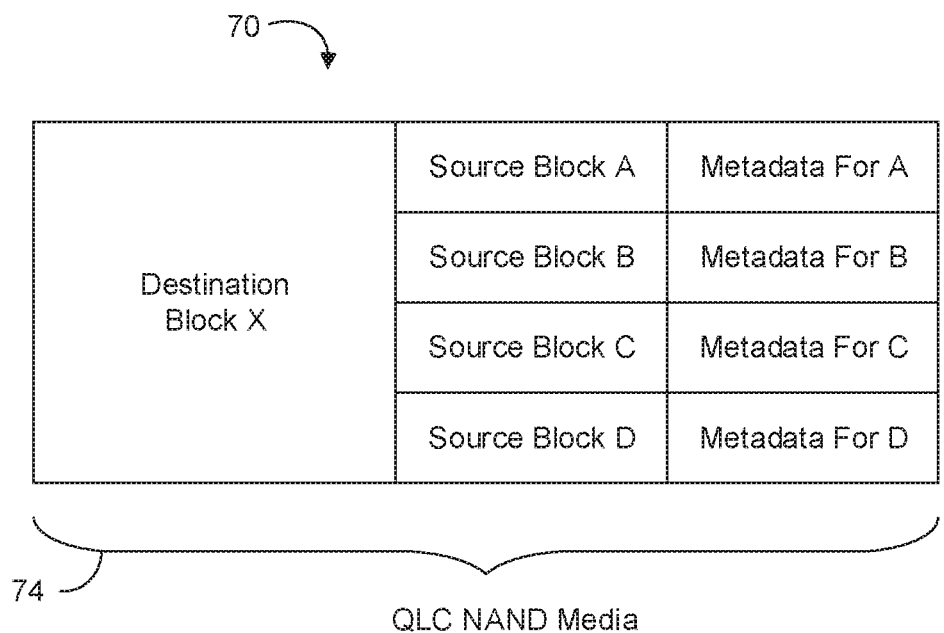

With reference to FIGS. 7A to 7B, an embodiment of a NAND storage device 70 includes SLC NAND media 72 and QLC NAND media 74. The SLC NAND media 72 is organized as one or more source blocks A, B, C, D, etc. The QLC NAND media 74 is organized as one or more destination blocks, of which one example destination block X is illustrated in FIG. 7B. The SLC NAND media 72 is faster media with smaller block sizes, while the QLC NAND media is slower media with larger block sizes (e.g., with many source blocks fitting within one destination block). When data from the faster media is copied to the slower media (e.g., using a copyback operation), in accordance with some embodiments, the source block (faster media) data is copied over to the destination block (slower media) and corresponding metadata is stored that identifies which source block is the original source of the data. If the data from this destination block is subsequently read by the host or is subsequently read during a garbage collection process and the data happens to have high bit errors, the firmware triggers an error recovery mechanism. Advantageously, the metadata may be used to identify the original source block associated with the erroneous data. The firmware may then determine which of either the source block or the destination block is the failed block and retire the failed block. Any suitable data structure may be maintained to store the metadata including, for example, a table, a list, a database, etc. The metadata may be stored in the destination block, at any other suitable block of the storage device 70, or at any other memory location accessible to the controller.

Figure 8:
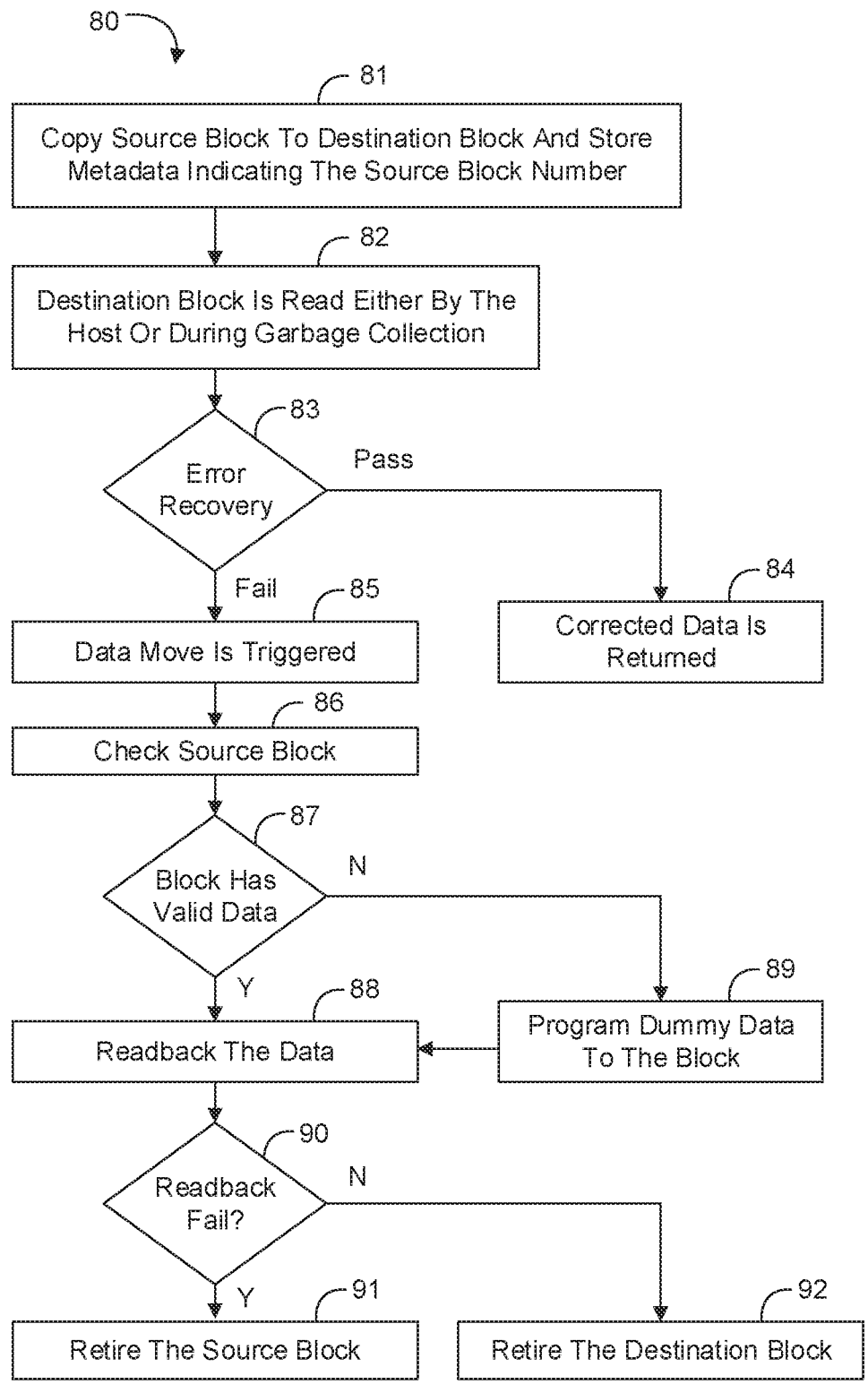
FIG. 8 is a flowchart of an example of another method of controlling storage according to an embodiment.

With reference to FIG. 8, an embodiment of a method 80 of controlling storage may include copying data from a source block to a destination block and storing metadata indicating the source block number at box 81. At box 82, the destination block is read either by the host or during garbage collection. If the data happens to have high bit errors, the firmware triggers an error recovery mechanism at box 83. If the error recovery passes, the corrected data is returned at box 84. Otherwise, if the error recovery fails at box 83, a data move is triggered in the firmware at box 85 to copy the valid data to another block.

After the data move is completed, the method 80 includes the firmware checking the source block at box 86, first reading the metadata associated with the destination block to identify which source block the data in the failing destination block was copied from. If the identified source block has valid data at box 87, the firmware performs a read-back on the existing data in the source block at box 88 to check for any bit errors. Otherwise, the firmware programs dummy data to the block at box 89 prior to reading it back at box 88. If the read-back fails at box 90, the firmware retires the source block at box 91 because the source block is the corrupted block. If the read-back passes at box 90, the firmware acknowledges the destination block to be the corrupted block and retires the destination block at box 92.

The technology discussed herein may be provided in various computing systems (e.g., including a non-mobile computing device such as a desktop, workstation, server, rack system, etc., a mobile computing device such as a smartphone, tablet, Ultra-Mobile Personal Computer (UMPC), laptop computer, ULTRABOOK computing device, smart watch, smart glasses, smart bracelet, etc., and/or a client/edge device such as an Internet-of-Things (IoT) device (e.g., a sensor, a camera, etc.)).

Figure 9:
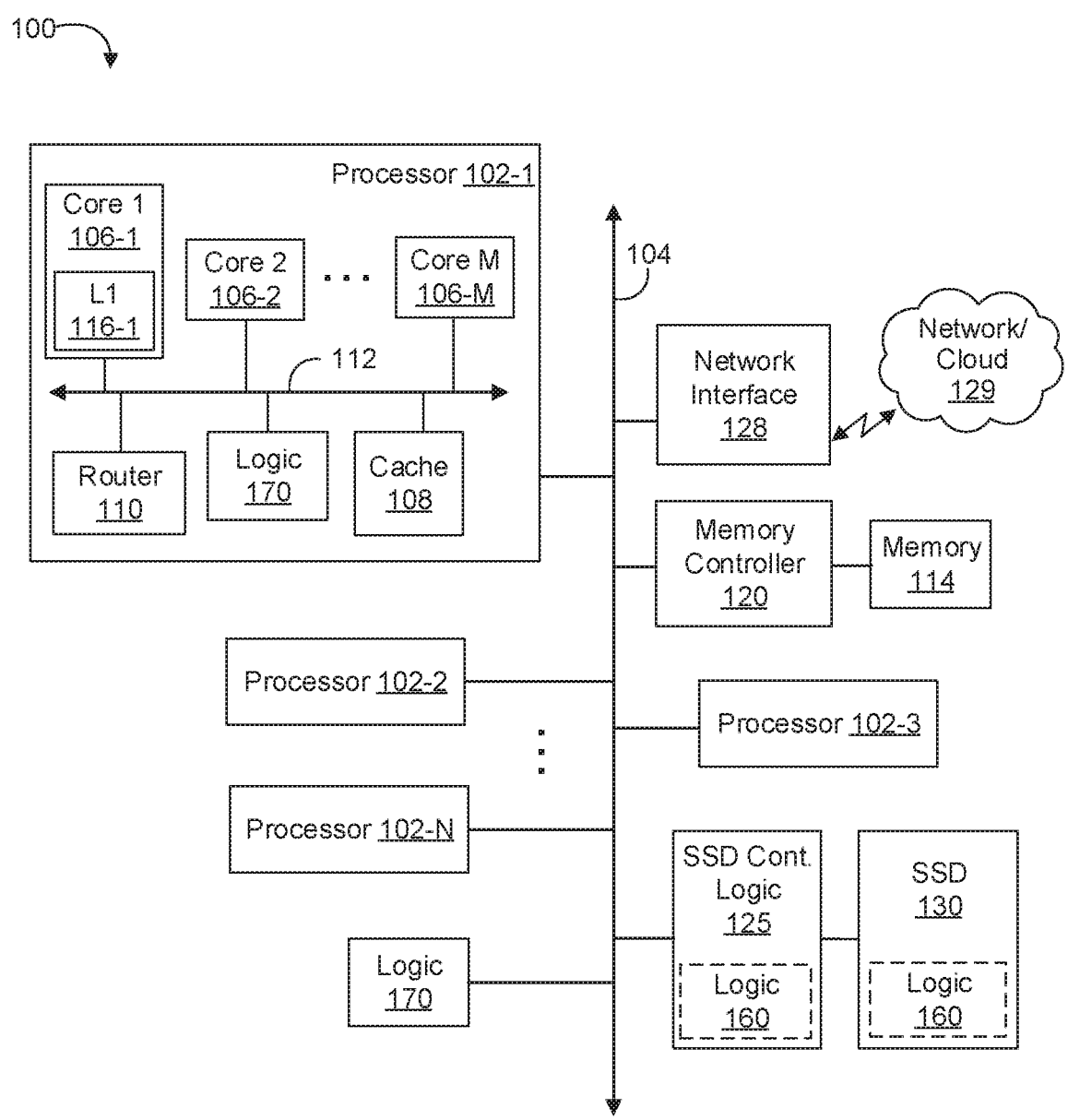
FIG. 9 is a block diagram of an example of a computing system according to an embodiment.

Turning now to FIG. 9, an embodiment of a computing system 100 may include one or more processors 102-1 through 102-N (generally referred to herein as "processors 102" or "processor 102"). The processors 102 may communicate via an interconnection or bus 104. Each processor 102 may include various components some of which are only discussed with reference to processor 102-1 for clarity. Accordingly, each of the remaining processors 102-2 through 102-N may include the same or similar components discussed with reference to the processor 102-1.

In some embodiments, the processor 102-1 may include one or more processor cores 106-1 through 106-M (referred to herein as "cores 106," or more generally as "core 106"), a cache 108 (which may be a shared cache or a private cache in various embodiments), and/or a router 110. The processor cores 106 may be implemented on a single integrated circuit (IC) chip. Moreover, the chip may include one or more shared and/or private caches (such as cache 108), buses or interconnections (such as a bus or interconnection 112), logic 170, memory controllers, or other components.

In some embodiments, the router 110 may be used to communicate between various components of the processor 102-1 and/or system 100. Moreover, the processor 102-1 may include more than one router 110. Furthermore, the multitude of routers 110 may be in communication to enable data routing between various components inside or outside of the processor 102-1.

The cache 108 may store data (e.g., including instructions) that is utilized by one or more components of the processor 102-1, such as the cores 106. For example, the cache 108 may locally cache data stored in a memory 114 for faster access by the components of the processor 102. As shown in FIG. 9, the memory 114 may be in communication with the processors 102 via the interconnection 104. In some embodiments, the cache 108 (that may be shared) may have various levels, for example, the cache 108 may be a mid-level cache and/or a last-level cache (LLC). Also, each of the cores 106 may include a level 1 (L1) cache (116-1) (generally referred to herein as "L1 cache 116"). Various components of the processor 102-1 may communicate with the cache 108 directly, through a bus (e.g., the bus 112), and/or a memory controller or hub.

As shown in FIG. 9, memory 114 may be coupled to other components of system 100 through a memory controller 120. Memory 114 may include volatile memory and may be interchangeably referred to as main memory. Even though the memory controller 120 is shown to be coupled between the interconnection 104 and the memory 114, the memory controller 120 may be located elsewhere in system 100. For example, memory controller 120 or portions of it may be provided within one of the processors 102 in some embodiments.

The system 100 may communicate with other devices/systems/networks via a network interface 128 (e.g., which is in communication with a computer network and/or the cloud 129 via a wired or wireless interface). For example, the network interface 128 may include an antenna (not shown) to wirelessly (e.g., via an Institute of Electrical and Electronics Engineers (IEEE) 802.11 interface (including IEEE 802.11a/b/g/n/ac, etc.), cellular interface, 3G, 4G, LTE, BLUETOOTH, etc.) communicate with the network/cloud 129.

System 100 may also include a storage device such as a SSD device 130 coupled to the interconnect 104 via SSD controller logic 125. Hence, logic 125 may control access by various components of system 100 to the SSD device 130. Furthermore, even though logic 125 is shown to be directly coupled to the interconnection 104 in FIG. 9, logic 125 can alternatively communicate via a storage bus/interconnect (such as the SATA (Serial Advanced Technology Attachment) bus, Peripheral Component Interconnect (PCI) (or PCI EXPRESS (PCIe) interface), NVM EXPRESS (NVMe), etc.) with one or more other components of system 100 (for example where the storage bus is coupled to interconnect 104 via some other logic like a bus bridge, chipset, etc.) Additionally, logic 125 may be incorporated into memory controller logic (such as those discussed with reference to FIG. 10) or provided on a same integrated circuit (IC) device in various embodiments (e.g., on the same circuit board device as the SSD device 130 or in the same enclosure as the SSD device 130).

Furthermore, logic 125 and/or SSD device 130 may be coupled to one or more sensors (not shown) to receive information (e.g., in the form of one or more bits or signals) to indicate the status of or values detected by the one or more sensors. These sensor(s) may be provided proximate to components of system 100 (or other computing systems discussed herein), including the cores 106, interconnections 104 or 112, components outside of the processor 102, SSD device 130, SSD bus, SATA bus, logic 125, logic 160, logic 170, etc., to sense variations in various factors affecting power/thermal behavior of the system/platform, such as temperature, operating frequency, operating voltage, power consumption, and/or inter-core communication activity, etc.

Figure 10:
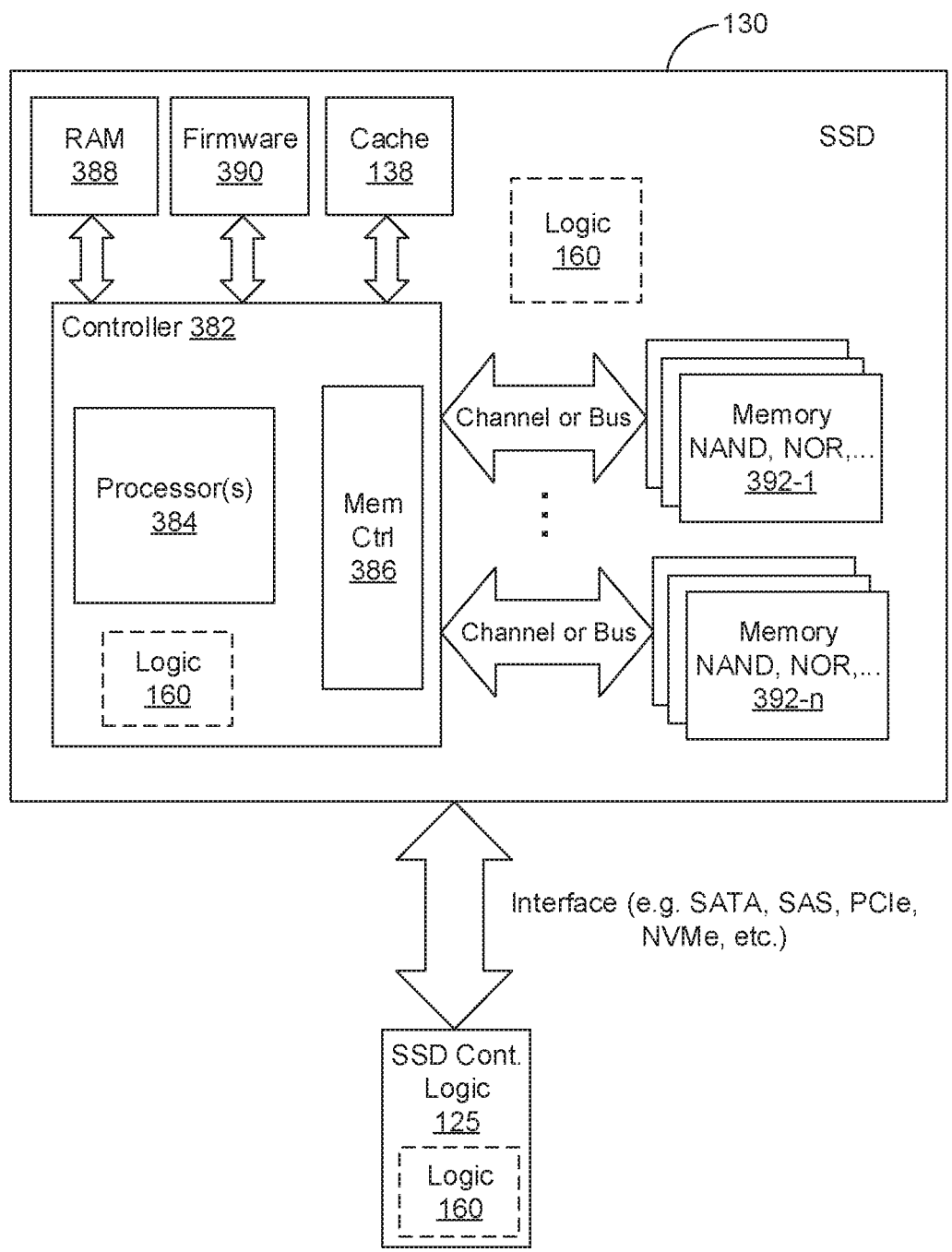
FIG. 10 is a block diagram of an example of a solid-state drive (SSD) according to an embodiment.

FIG. 10 illustrates a block diagram of various components of the SSD device 130, according to an embodiment. As illustrated in FIG. 10, logic 160 may be located in various locations such as inside the SSD device 130 or controller 382, etc., and may include similar technology as discussed in connection with FIG. 9. The SSD device 130 includes a controller 382 (which in turn includes one or more processor cores or processors 384 and memory controller logic 386), cache 138, RAM 388, firmware storage 390, and one or more memory devices 392-1 to 392-N (collectively memory 392, which may include NAND flash, NOR flash, or other types of non-volatile memory). The memory 392 is coupled to the memory controller logic 386 via one or more memory channels or busses. Also, SSD device 130 communicates with logic 125 via an interface (such as a SATA, SAS, PCIe, NVMe, etc., interface). One or more of the features/aspects/operations discussed with reference to FIGS. 1-8 may be performed by one or more of the components of FIG. 10. Processors 384 and/or controller 382 may compress/decompress (or otherwise cause compression/decompression of) data written to or read from memory devices 392-1 to 392-N. Also, one or more of the features/aspects/operations of FIGS. 1-8 may be programmed into the firmware 390. Further, SSD controller logic 125 may also include logic 160.

As illustrated in FIGS. 9 and 10, the SSD device 130 may include logic 160, which may be in the same enclosure as the SSD device 130 and/or fully integrated on a printed circuit board (PCB) of the SSD device 130. The system 100 may include further logic 170 outside of the SSD device 130. Advantageously, the logic 160 and/or logic 170 may include technology to implement one or more aspects of the method 20 (FIGS. 3A to 3E), the method 50 (FIG. 5), the method 60 (FIG. 6), the method 80 (FIG. 8) the system 10, the apparatus 15, the SSD 45, the NAND storage device 70, and/or any of the features discussed herein. For example, the logic 170 may include technology to implement the host device/computer system/agent aspects of the various embodiments described herein (e.g., requesting information from the SSD device 130, sending information to the SSD device 130, etc.).

For example, the memory 392 may include SLC NAND media to store source blocks and QLC NAND media to store destination blocks and the logic 160 may include technology to determine if an error rate associated with a read of a particular destination block of the destination blocks exceeds a threshold error rate, to identify a particular source block of the source blocks which corresponds to erroneous data in the particular destination block, to determine which of the particular source block and the particular destination block is a failed block, and to retire the failed block. For example, the logic 160 may be configured to determine if a read of the particular source block fails or passes, retire the particular source block if the read is determined to fail, and retire the particular destination block if the read is determined to pass. In some embodiments, the logic 160 may also be configured to determine if the particular source block has valid data prior to the read of the particular source block, and program dummy data to the particular source block if the particular source block is determined to not have valid data.

In some embodiments, the logic 160 may be further configured to store data from the particular source block to the particular destination block, store metadata associated with the particular destination block which identifies the particular source block as a source of the data stored to the particular destination block, receive a read request for the particular destination block, read the data requested from the particular destination block, determine if the error rate associated with the read of the data exceeds the threshold error rate, move the data from the particular destination block to a second destination block if the error rate is determined to exceed the threshold error rate, and identify the particular source block based on the stored metadata associated with the particular destination block. For example, the logic 160 may also be configured to maintain a data structure which includes metadata to identify original source blocks for data stored in the one or more destination blocks.

In other embodiments, the SSD device 130 may be replaced with any suitable storage/memory technology/media. In some embodiments, the logic 160/170 may be coupled to one or more substrates (e.g., silicon, sapphire, gallium arsenide, printed circuit board (PCB), etc.), and may include transistor channel regions that are positioned within the one or more substrates. In other embodiments, the SSD device 130 may include two or more types of storage media. For example, the bulk of the storage may be NAND and may further include some faster, smaller granularity accessible (e.g., byte-addressable) NVM such as INTEL 3DXP media. The SSD device 130 may alternatively, or additionally, include persistent volatile memory (e.g., battery or capacitor backed-up DRAM or SRAM). For example, the SSD device 130 may include POWER LOSS IMMINENT (PLI) technology with energy storing capacitors. The energy storing capacitors may provide enough energy (power) to complete any commands in progress and to make sure that any data in the DRAMs/SRAMs is committed to the non-volatile NAND media. The capacitors may act as backup batteries for the persistent volatile memory. As shown in FIG. 9, features or aspects of the logic 160 and/or the logic 170 may be distributed throughout the system 100, and/or co-located/integrated with various components of the system 100.

ADDITIONAL NOTES AND EXAMPLES

Example 1 includes an electronic apparatus, comprising one or more substrates, and logic coupled to the one or more substrates, the logic to control a persistent storage media including a first media to store one or more source blocks of data and a second media to store one or more destination blocks of data, determine if an error rate associated with a read of a particular destination block of the one or more destination blocks exceeds a threshold error rate, identify a particular source block of the one or more source blocks which corresponds to erroneous data in the particular destination block, determine which of the particular source block and the particular destination block is a failed block, and retire the failed block.

Example 2 includes the apparatus of Example 1, wherein the logic is further to determine if a read of the particular source block fails or passes, retire the particular source block if the read is determined to fail, and retire the particular destination block if the read is determined to pass.

Example 3 includes the apparatus of Example 2, wherein the logic is further to determine if the particular source block has valid data prior to the read of the particular source block, and program dummy data to the particular source block if the particular source block is determined to not have valid data.

Example 4 includes the apparatus of any of Examples 1 to 3, wherein the logic is further to store data from the particular source block to the particular destination block, store metadata associated with the particular destination block which identifies the particular source block as a source of the data stored to the particular destination block, receive a read request for the particular destination block, read the data requested from the particular destination block, determine if the error rate associated with the read of the data exceeds the threshold error rate, move the data from the particular destination block to a second destination block if the error rate is determined to exceed the threshold error rate, and identify the particular source block based on the stored metadata associated with the particular destination block.

Example 5 includes the apparatus of Example 4, wherein the logic is further to maintain a data structure which includes metadata to identify original source blocks for data stored in the one or more destination blocks.

Example 6 includes the apparatus of any of Examples 1 to 5, wherein the persistent storage media comprises a solid state drive and wherein one or more of a block size characteristic and a performance characteristic are different with respect to the first and second media.

Example 7 includes the apparatus of Example 6, wherein the first media comprises faster media as compared to the second media.

Example 8 includes an electronic storage system, comprising persistent storage media including a first media to store one or more source blocks of data and a second media to store one or more destination blocks of data, and a controller coupled to the persistent storage media, the controller including logic to determine if an error rate associated with a read of a particular destination block of the one or more destination blocks exceeds a threshold error rate, identify a particular source block of the one or more source blocks which corresponds to erroneous data in the particular destination block, determine which of the particular source block and the particular destination block is a failed block, and retire the failed block.

Example 9 includes the system of Example 8, wherein the logic is further to determine if a read of the particular source block fails or passes, retire the particular source block if the read is determined to fail, and retire the particular destination block if the read is determined to pass.

Example 10 includes the system of Example 9, wherein the logic is further to determine if the particular source block has valid data prior to the read of the particular source block, and program dummy data to the particular source block if the particular source block is determined to not have valid data.

Example 11 includes the system of any of Examples 8 to 10, wherein the logic is further to store data from the particular source block to the particular destination block, store metadata associated with the particular destination block which identifies the particular source block as a source of the data stored to the particular destination block, receive a read request for the particular destination block, read the data requested from the particular destination block, determine if the error rate associated with the read of the data exceeds the threshold error rate, move the data from the particular destination block to a second destination block if the error rate is determined to exceed the threshold error rate, and identify the particular source block based on the stored metadata associated with the particular destination block.

Example 12 includes the system of Example 11, wherein the logic is further to maintain a data structure which includes metadata to identify original source blocks for data stored in the one or more destination blocks.

Example 13 includes the system of any of Examples 8 to 12, wherein the persistent storage media comprises a solid state drive and wherein one or more of a block size characteristic and a performance characteristic are different with respect to the first and second media.

Example 14 includes the system of Example 13, wherein the first media comprises faster media as compared to the second media.

Example 15 includes a method of controlling storage, comprising controlling a persistent storage media including a first media to store one or more source blocks of data and a second media to store one or more destination blocks of data, determining if an error rate associated with a read of a particular destination block of the one or more destination blocks exceeds a threshold error rate, identifying a particular source block of the one or more source blocks which corresponds to erroneous data in the particular destination block, determining which of the particular source block and the particular destination block is a failed block, and retiring the failed block.

Example 16 includes the method of Example 15, further comprising determining if a read of the particular source block fails or passes, retiring the particular source block if the read is determined to fail, and retiring the particular destination block if the read is determined to pass.

Example 17 includes the method of Example 16, further comprising determining if the particular source block has valid data prior to the read of the particular source block, and programming dummy data to the particular source block if the particular source block is determined to not have valid data.

Example 18 includes the method of any of Examples 15 to 17, further comprising storing data from the particular source block to the particular destination block, storing metadata associated with the particular destination block which identifies the particular source block as a source of the data stored to the particular destination block, receiving a read request for the particular destination block, reading the data requested from the particular destination block, determining if the error rate associated with the read of the data exceeds the threshold error rate, moving the data from the particular destination block to a second destination block if the error rate is determined to exceed the threshold error rate, and identifying the particular source block based on the stored metadata associated with the particular destination block.

Example 19 includes the method of Example 18, further comprising maintaining a data structure which includes metadata to identify original source blocks for data stored in the one or more destination blocks.

Example 20 includes the method of any of Examples 15 to 19, wherein the persistent storage media comprises a solid state drive and wherein one or more of a block size characteristic and a performance characteristic are different with respect to the first and second media.

Example 21 includes the method of Example 20, wherein the first media comprises faster media as compared to the second media.

Example 22 includes at least one non-transitory one machine readable medium comprising a plurality of instructions that, in response to being executed on a computing device, cause the computing device to control a persistent storage media including a first media to store one or more source blocks of data and a second media to store one or more destination blocks of data, determine if an error rate associated with a read of a particular destination block of the one or more destination blocks exceeds a threshold error rate, identify a particular source block of the one or more source blocks which corresponds to erroneous data in the particular destination block, determine which of the particular source block and the particular destination block is a failed block, and retire the failed block.

Example 23 includes the at least one non-transitory one machine readable medium of Example 22, comprising a plurality of further instructions that, in response to being executed on the computing device, cause the computing device to determine if a read of the particular source block fails or passes, retire the particular source block if the read is determined to fail, and retire the particular destination block if the read is determined to pass.

Example 24 includes the at least one non-transitory one machine readable medium of Example 23, comprising a plurality of further instructions that, in response to being executed on the computing device, cause the computing device to determine if the particular source block has valid data prior to the read of the particular source block, and program dummy data to the particular source block if the particular source block is determined to not have valid data.

Example 25 includes the at least one non-transitory one machine readable medium of any of Examples 22 to 24, comprising a plurality of further instructions that, in response to being executed on the computing device, cause the computing device to store data from the particular source block to the particular destination block, store metadata associated with the particular destination block which identifies the particular source block as a source of the data stored to the particular destination block, receive a read request for the particular destination block, read the data requested from the particular destination block, determine if the error rate associated with the read of the data exceeds the threshold error rate, move the data from the particular destination block to a second destination block if the error rate is determined to exceed the threshold error rate, and identify the particular source block based on the stored metadata associated with the particular destination block.

Example 26 includes the at least one non-transitory one machine readable medium of Example 25, comprising a plurality of further instructions that, in response to being executed on the computing device, cause the computing device to maintain a data structure which includes metadata to identify original source blocks for data stored in the one or more destination blocks.

Example 27 includes the at least one non-transitory one machine readable medium of any of Examples 22 to 26, wherein the persistent storage media comprises a solid state drive and wherein one or more of a block size characteristic and a performance characteristic are different with respect to the first and second media.

Example 28 includes the at least one non-transitory one machine readable medium of Example 27, wherein the first media comprises faster media as compared to the second media.

Example 29 includes a storage controller apparatus, comprising means for controlling a persistent storage media including a first media to store one or more source blocks of data and a second media to store one or more destination blocks of data, means for determining if an error rate associated with a read of a particular destination block of the one or more destination blocks exceeds a threshold error rate, means for identifying a particular source block of the one or more source blocks which corresponds to erroneous data in the particular destination block, means for determining which of the particular source block and the particular destination block is a failed block, and means for retiring the failed block.

Example 30 includes the apparatus of Example 29, further comprising means for determining if a read of the particular source block fails or passes, means for retiring the particular source block if the read is determined to fail, and means for retiring the particular destination block if the read is determined to pass.

Example 31 includes the apparatus of Example 30, further comprising means for determining if the particular source block has valid data prior to the read of the particular source block, and means for programming dummy data to the particular source block if the particular source block is determined to not have valid data.

Example 32 includes the apparatus of any of Examples 29 to 31, further comprising means for storing data from the particular source block to the particular destination block, means for storing metadata associated with the particular destination block which identifies the particular source block as a source of the data stored to the particular destination block, means for receiving a read request for the particular destination block, means for reading the data requested from the particular destination block, means for determining if the error rate associated with the read of the data exceeds the threshold error rate, means for moving the data from the particular destination block to a second destination block if the error rate is determined to exceed the threshold error rate, and means for identifying the particular source block based on the stored metadata associated with the particular destination block.

Example 33 includes the apparatus of Example 32, further comprising means for maintaining a data structure which includes metadata to identify original source blocks for data stored in the one or more destination blocks.

Example 34 includes the apparatus of any of Examples 29 to 33, wherein the persistent storage media comprises a solid state drive and wherein one or more of a block size characteristic and a performance characteristic are different with respect to the first and second media.

Example 35 includes the apparatus of Example 34, wherein the first media comprises faster media as compared to the second media.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrase "one or more of A, B, and C" and the phrase "one or more of A, B, or C" both may mean A; B; C; A and B; A and C; B and C; or A, B and C. Various components of the systems described herein may be implemented in software, firmware, and/or hardware and/or any combination thereof. For example, various components of the systems or devices discussed herein may be provided, at least in part, by hardware of a computing SoC such as may be found in a computing system such as, for example, a smart phone. Those skilled in the art may recognize that systems described herein may include additional components that have not been depicted in the corresponding figures. For example, the systems discussed herein may include additional components such as bit stream multiplexer or de-multiplexer modules and the like that have not been depicted in the interest of clarity.

While implementation of the example processes discussed herein may include the undertaking of all operations shown in the order illustrated, the present disclosure is not limited in this regard and, in various examples, implementation of the example processes herein may include only a subset of the operations shown, operations performed in a different order than illustrated, or additional operations.

In addition, any one or more of the operations discussed herein may be undertaken in response to instructions provided by one or more computer program products. Such program products may include signal bearing media providing instructions that, when executed by, for example, a processor, may provide the functionality described herein. The computer program products may be provided in any form of one or more machine-readable media. Thus, for example, a processor including one or more graphics processing unit(s) or processor core(s) may undertake one or more of the blocks of the example processes herein in response to program code and/or instructions or instruction sets conveyed to the processor by one or more machine-readable media. In general, a machine-readable medium may convey software in the form of program code and/or instructions or instruction sets that may cause any of the devices and/or systems described herein to implement at least portions of the operations discussed herein and/or any portions the devices, systems, or any module or component as discussed herein.

As used in any implementation described herein, the term "module" refers to any combination of software logic, firmware logic, hardware logic, and/or circuitry configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, fixed function circuitry, execution unit circuitry, and/or firmware that stores instructions executed by programmable circuitry. The modules may, collectively or individually, be embodied as circuitry that forms part of a larger system, for example, an integrated circuit (IC), system on-chip (SoC), and so forth.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

One or more aspects of at least one embodiment may be implemented by representative instructions stored on a machine-readable medium which represents various logic within the processor, which when read by a machine causes the machine to fabricate logic to perform the techniques described herein. Such representations, known as IP cores may be stored on a tangible, machine readable medium and supplied to various customers or manufacturing facilities to load into the fabrication machines that actually make the logic or processor.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the embodiments are not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the embodiments should, therefore, be determined with reference to the appended claims, along with the full scope of equivalents to which such claims are entitled.

What is claimed is:

1. An electronic apparatus, comprising:
one or more substrates; and
logic coupled to the one or more substrates, the logic to:
control a persistent storage media including a first media to store one or more source blocks of data and a second media to store one or more destination blocks of data,
determine if an error rate associated with a read of a particular destination block of the one or more destination blocks exceeds a threshold error rate,
identify a particular source block of the one or more source blocks which corresponds to erroneous data in the particular destination block,
determine which of the particular source block and the particular destination block is a failed block, and
retire the failed block.

2. The apparatus of claim 1, wherein the logic is further to:
determine if a read of the particular source block fails or passes;
retire the particular source block if the read is determined to fail; and
retire the particular destination block if the read is determined to pass.

3. The apparatus of claim 2, wherein the logic is further to:
determine if the particular source block has valid data prior to the read of the particular source block; and
program dummy data to the particular source block if the particular source block is determined to not have valid data.

4. The apparatus of claim 1, wherein, prior to retirement of the failed block, the logic is further to:
store data from the particular source block to the particular destination block;
store metadata associated with the particular destination block which identifies the particular source block as a source of the data stored to the particular destination block;
receive a read request for the particular destination block;
read the data requested from the particular destination block;
determine if the error rate associated with the read of the data exceeds the threshold error rate;
move the data from the particular destination block to a second destination block if the error rate is determined to exceed the threshold error rate; and
identify the particular source block based on the stored metadata associated with the particular destination block.

5. The apparatus of claim 4, wherein the logic is further to:
maintain a data structure which includes metadata to identify original source blocks for data stored in the one or more destination blocks.

6. The apparatus of claim 1, wherein the persistent storage media comprises a solid state drive and wherein one or more of a block size characteristic and a performance characteristic are different with respect to the first and second media.

7. The apparatus of claim 6, wherein the first media comprises faster media as compared to the second media.

8. An electronic storage system, comprising:
persistent storage media including a first media to store one or more source blocks of data and a second media to store one or more destination blocks of data; and
a controller coupled to the persistent storage media, the controller including logic to:
determine if an error rate associated with a read of a particular destination block of the one or more destination blocks exceeds a threshold error rate,
identify a particular source block of the one or more source blocks which corresponds to erroneous data in the particular destination block,
determine which of the particular source block and the particular destination block is a failed block, and
retire the failed block.

9. The system of claim 8, wherein the logic is further to:
determine if a read of the particular source block fails or passes;
retire the particular source block if the read is determined to fail; and
retire the particular destination block if the read is determined to pass.

10. The system of claim 9, wherein the logic is further to:
determine if the particular source block has valid data prior to the read of the particular source block; and
program dummy data to the particular source block if the particular source block is determined to not have valid data.

11. The system of claim 8, wherein, prior to retirement of the failed block, the logic is further to:
store data from the particular source block to the particular destination block;
store metadata associated with the particular destination block which identifies the particular source block as a source of the data stored to the particular destination block;
receive a read request for the particular destination block;
read the data requested from the particular destination block;
determine if the error rate associated with the read of the data exceeds the threshold error rate;
move the data from the particular destination block to a second destination block if the error rate is determined to exceed the threshold error rate; and
identify the particular source block based on the stored metadata associated with the particular destination block.

12. The system of claim 11, wherein the logic is further to:
maintain a data structure which includes metadata to identify original source blocks for data stored in the one or more destination blocks.

13. The system of claim 8, wherein the persistent storage media comprises a solid state drive and wherein one or more of a block size characteristic and a performance characteristic are different with respect to the first and second media.

14. The system of claim 13, wherein the first media comprises faster media as compared to the second media.

15. A method of controlling storage, comprising:
controlling a persistent storage media including a first media to store one or more source blocks of data and a second media to store one or more destination blocks of data;
determining if an error rate associated with a read of a particular destination block of the one or more destination blocks exceeds a threshold error rate;
identifying a particular source block of the one or more source blocks which corresponds to erroneous data in the particular destination block;
determining which of the particular source block and the particular destination block is a failed block; and
retiring the failed block.

16. The method of claim 15, further comprising:
determining if a read of the particular source block fails or passes;
retiring the particular source block if the read is determined to fail; and
retiring the particular destination block if the read is determined to pass.

17. The method of claim 16, further comprising:
determining if the particular source block has valid data prior to the read of the particular source block; and
programming dummy data to the particular source block if the particular source block is determined to not have valid data.

18. The method of claim 15, further comprising, prior to retiring the failed block:
storing data from the particular source block to the particular destination block;
storing metadata associated with the particular destination block which identifies the particular source block as a source of the data stored to the particular destination block;
receiving a read request for the particular destination block;
reading the data requested from the particular destination block;
determining if the error rate associated with the read of the data exceeds the threshold error rate;
moving the data from the particular destination block to a second destination block if the error rate is determined to exceed the threshold error rate; and
identifying the particular source block based on the stored metadata associated with the particular destination block.

19. The method of claim 18, further comprising:
maintaining a data structure which includes metadata to identify original source blocks for data stored in the one or more destination blocks.

20. The method of claim 15, wherein the persistent storage media comprises a solid state drive and wherein one or more of a block size characteristic and a performance characteristic are different with respect to the first and second media.

* * * * *